United States Patent
Bernstein et al.

(10) Patent No.: US 7,928,548 B2
(45) Date of Patent: Apr. 19, 2011

(54) SILICON HEAT SPREADER MOUNTED IN-PLANE WITH A HEAT SOURCE AND METHOD THEREFOR

(75) Inventors: Kerry Bernstein, Underhill, VT (US); Sri M. Sri-Jayantha, Ossining, NY (US)

(73) Assignee: International Business Machines Corporation, Armonk, NY (US)

(*) Notice: Subject to any disclaimer, the term of this patent is extended or adjusted under 35 U.S.C. 154(b) by 478 days.

(21) Appl. No.: 11/970,353

(22) Filed: Jan. 7, 2008

(65) Prior Publication Data
US 2009/0174050 A1     Jul. 9, 2009

(51) Int. Cl.
H01L 23/36       (2006.01)
H01L 21/50       (2006.01)
H05K 7/20        (2006.01)

(52) U.S. Cl. ......... 257/684; 257/E23.101; 257/E21.499; 257/712; 257/713; 257/717; 257/720; 257/675

(58) Field of Classification Search .......... 257/684, 257/E21.499, E23.101, 712, 717, 713, 720, 257/675
See application file for complete search history.

(56) References Cited

U.S. PATENT DOCUMENTS

| | | | | |
|---|---|---|---|---|
| 5,777,385 A * | 7/1998 | Wu | ............... | 257/712 |
| 6,727,422 B2 * | 4/2004 | Macris | ............... | 136/201 |
| 7,204,298 B2 * | 4/2007 | Hodes et al. | ............... | 165/80.4 |
| 7,268,427 B2 * | 9/2007 | Anzai | ............... | 257/707 |
| 7,290,596 B2 * | 11/2007 | Yang et al. | ............... | 165/146 |
| 7,347,621 B2 * | 3/2008 | Sri-Jayantha et al. | ......... | 374/166 |
| 7,361,985 B2 * | 4/2008 | Yuan et al. | ............... | 257/713 |
| 7,391,067 B1 * | 6/2008 | Kumar | ............... | 257/276 |
| 7,492,041 B2 * | 2/2009 | Ravi et al. | ............... | 257/706 |
| 7,654,311 B2 * | 2/2010 | Yang et al. | ............... | 165/185 |
| 7,695,188 B2 * | 4/2010 | Sri-Jayantha et al. | ......... | 374/110 |
| 2002/0063330 A1 * | 5/2002 | Macris | ............... | 257/712 |
| 2002/0134419 A1 * | 9/2002 | Macris | ............... | 136/204 |
| 2006/0260793 A1 * | 11/2006 | Yang et al. | ............... | 165/185 |

* cited by examiner

*Primary Examiner* — Alexander O Williams
(74) *Attorney, Agent, or Firm* — McGinn IP Law Group, PLLC

(57) ABSTRACT

A heat spreader attached to a heat source that includes a semiconductor chip includes a silicon structure that provides a plurality of heat flux paths, including a lateral, in-plane heat flux path. The heat spreader is mounted in-plane with the heat source.

12 Claims, 10 Drawing Sheets

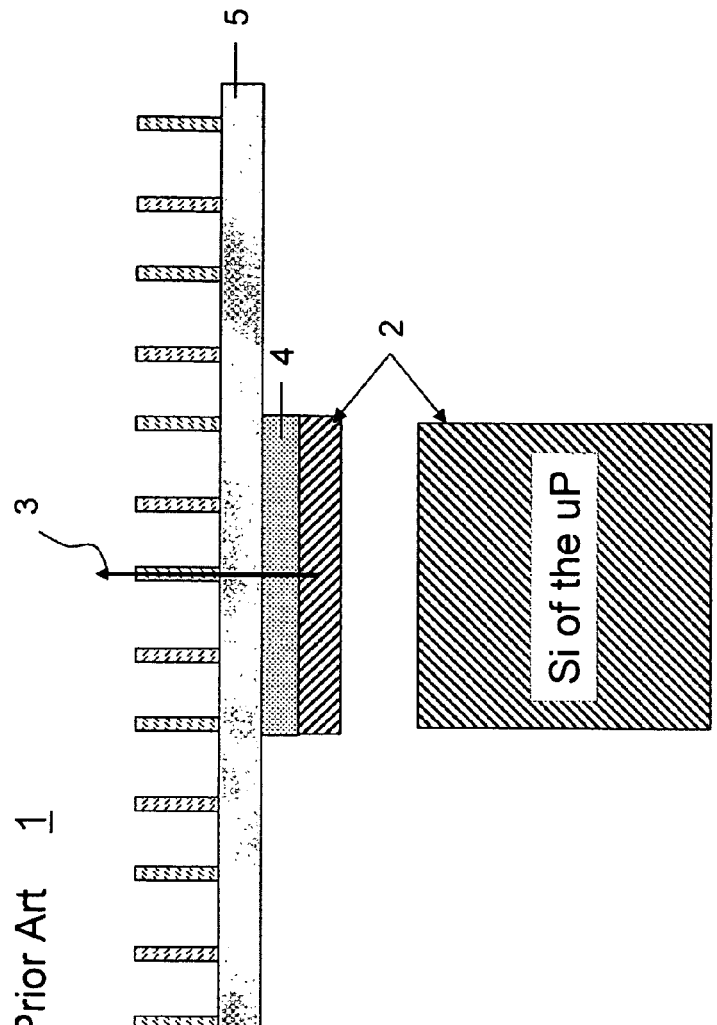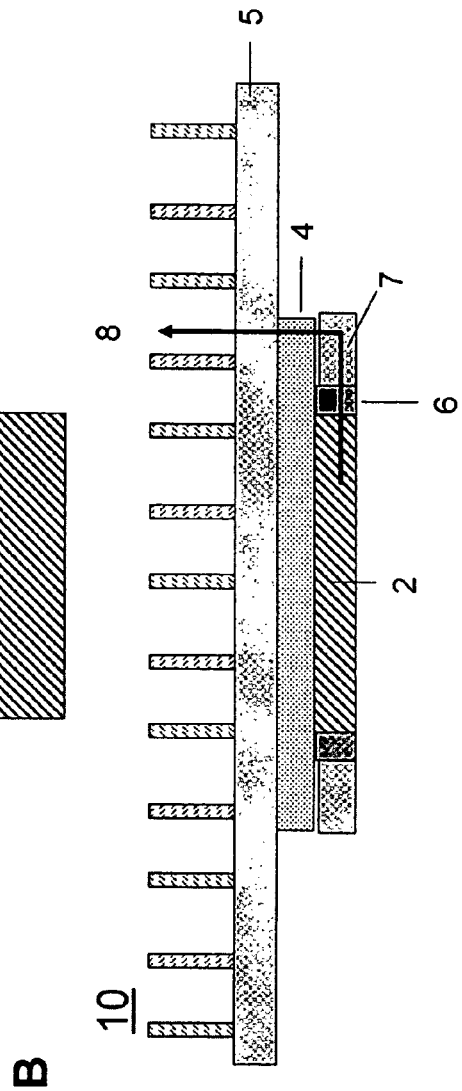
Figure 1A Prior Art
Figure 1B

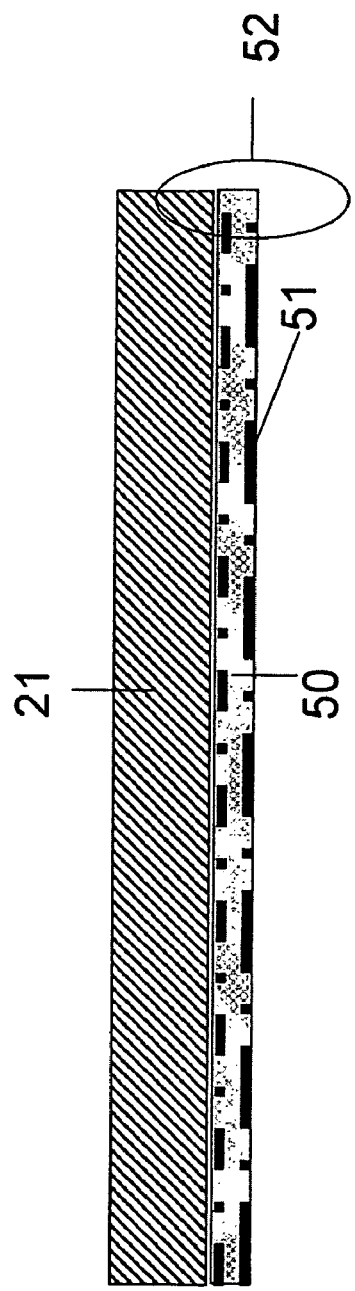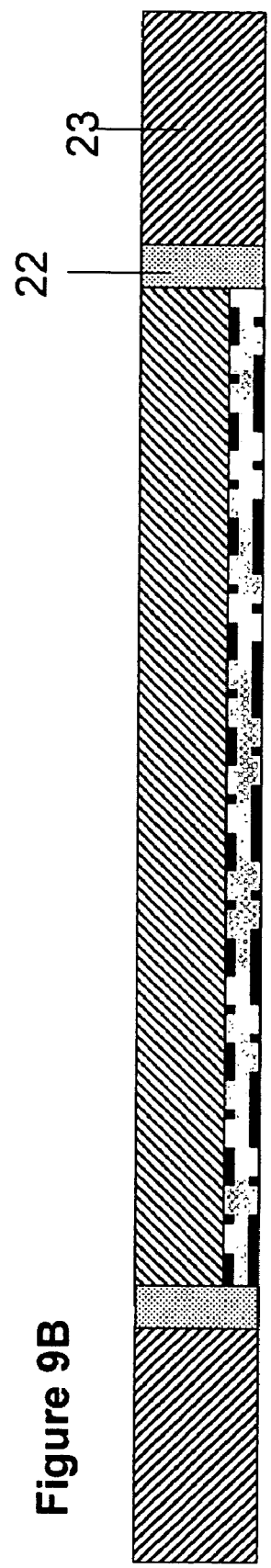
Figure 9A
Figure 9B

SILICON HEAT SPREADER MOUNTED IN-PLANE WITH A HEAT SOURCE AND METHOD THEREFOR

BACKGROUND OF THE INVENTION

1. Field of the Invention

The present invention generally relates to a method and apparatus for extracting heat from electronic devices, and more particularly to a method and apparatus for extracting additional heat laterally, using an in-plane structure, from high power devices with high efficiency, and even more particularly to extracting such heat from semiconductor devices fabricated on a silicon die.

2. Description of the Related Art

The competitive trend in electronic industry is to provide more useful functions in an electronic module at higher speeds while ever reducing the cost. The transistors that are the building blocks dissipate heat while active due to switching, and continue to dissipate heat due to leakage currents while idling. A problem area in many semiconductor devices is that the heat generated thereby affects performance of such devices. The switching characteristics of a digital logic becomes less reliable as temperature rises above 100 deg C. As a result, typically there some form of a cooling solution is provided to remove heat from the electronic device, and preferably off of the chip.

FIG. 1A is a schematic side view of a conventional configuration 1 of a semiconductor chip with components associated with thermal cooling. The transistors fabricated on a silicon chip can generate heat of the order of 100 W under active conditions. Generally, in such chips, all of the electronics of the chip are built in a very limited area (for example, 15 mm×15 mm). As a result, the heat flux density is typically very high. The heat is generated by the heat source 2 and it flows upwardly (as indicated by arrow 3) through a thermal interface material (TIM) 4 which is positioned between the heat source 2 and a heat sink 5. The TIM 4 material may be a conductive paste, gel, liquid-metal, or the like.

The heat sink 5 extracts the heat through the heat flux path 3 substantially in a direction perpendicular to the surface of the heat source 2. The heat sink 5 may be formed in a number of different conventional ways such as air-cooled heat fins supported on a copper block, a liquid cooled cold plate, etc., and may be formed of a heat-conducting material such as a metal or the like.

In such a structure, a problem results based on the high thermal resistance due to the restricted area of the chip. Indeed, the transistor density of a chip is becoming denser and denser, and the chip area is becoming smaller and smaller to achieve a certain logical function, for example, a floating point unit that facilitates multiplication. To achieve higher computational speed, the electronic circuits are typically confined to a very small area which gives rise to "hotspots" where the temperature tends to be higher (10-20 deg C.) than the remaining area of a chip. It is noted that even though silicon may be a good conductor by itself, because the silicon undergoes as many as 400 expensive process steps to build the electronics onto it, the silicon "real estate" is very expensive. Thus, even though for example, 100 W power is generated on an active chip, one is confined to only use the limited silicon area of a chip. That is, the thermal flux density is very high over the chip, thereby making the temperature of the chip very high and thereby limiting chip performance.

In sum, chip real estate is very costly (precious) and to increase such area to alleviate the high thermal resistance (and thus the heat flux) also is very costly, if not prohibitive.

The above problem is generally encountered in most semiconductor chips, but is especially problematic in some high performance microprocessors and game-chips that have multiple cores that dissipate substantially high power in the form of heat. High thermal condition not only affects the computational reliability of the electronic circuits, but also introduces thermomechanically-induced stresses in the components used to assemble an electronic module. In addition, higher temperature found near hotspots can contribute to degradation of the TIM material.

SUMMARY OF THE INVENTION

In view of the foregoing and other exemplary problems, drawbacks, and disadvantages of the conventional methods and structures, an exemplary feature of the present invention is to provide a method and structure in which a portion of the dissipated heat is extracted laterally, using an in-plane structure, from high power devices with high efficiency.

In a first aspect of the present invention, a method of (and apparatus for) dissipating heat from a heat source, includes providing a plurality of heat flux paths from the heat source, to remove the heat from the heat source.

An exemplary feature of the invention provides a structure (e.g., a silicon structure having a unique shape such as a "square-donut") which provides an alternate (or additional) path for heat flux removal from the heat source. That is, the invention provides a relatively thin slice of plain silicon (e.g., relatively cheap unprocessed silicon) (e.g., serving a function as a heat spreader and having no electronics therein provided on a plurality of edges (e.g., the four edges) of the processed silicon chip.

More specifically, the exemplary structure may fit snugly around a single silicon chip to enhance lateral heat transfer out, and up, to a conventional, larger heat sink (e.g., one having fins, etc., or the like).

As such, the invention provides a new conductive path in which to remove the heat flux from the heat source (e.g., microprocessor, etc.). The invention is especially effective where the silicon (heat spreader) is very thick (e.g., in a range of about 500 to about 750 µm).

That is, the thicker the plain silicon is, the more the resistance will be introduced in the vertical direction, but gives more area sideways to move the heat more laterally first and then outwardly. Instead of having device-quality silicon which is much wider in area, circuits can still be implemented on a smaller silicon chip, and a plain silicon substrate can be attached to the silicon chip in an appropriate way without introducing stresses due to thermal expansion, since the same material (e.g., silicon) is being employed and is removing outwardly an additional amount of heat.

In the disclosed exemplary configuration, the plain silicon is utilized to conduct heat to the same heat sink device. However, the plain silicon can be designed to provide an independent heat sinking function, for example, a liquid-assisted microchannel can be constructed to enhance heat removal from the edge of the microprocessor.

Another advantage of joining or fusing a plain-silicon structure on the bare edge of the chip containing the microprocessor circuits is that it eliminates structural discontinuity and relocates the bare edge on to the plain silicon. This attribute can protect the circuits by reducing stresses that cause cracking and delamination of the dielectric layers of a chip.

BRIEF DESCRIPTION OF THE DRAWINGS

The foregoing and other exemplary purposes, aspects and advantages will be better understood from the following detailed description of an exemplary embodiment of the invention with reference to the drawings, in which:

FIG. 1A illustrates a conventional heat evacuation structure (i.e., a heat sink) for a semiconductor structure (i.e., a semiconductor processor chip, silicon chip, etc.);

FIG. 1B illustrates a heat removal structure (i.e., a heat sink) for a semiconductor structure (i.e., a semiconductor processor chip, silicon chip, etc.) according to the present invention;

FIG. 9A shows a layer of the multilayer chip stack 80, in which dielectric 50 and circuit interconnects 51 are built on a silicon die; and FIG. 9B shows a structure similar to FIG. 9A, but in which vulnerability to cracks or delamination is reduced.

DETAILED DESCRIPTION OF EXEMPLARY EMBODIMENTS OF THE INVENTION

Figure 2A:
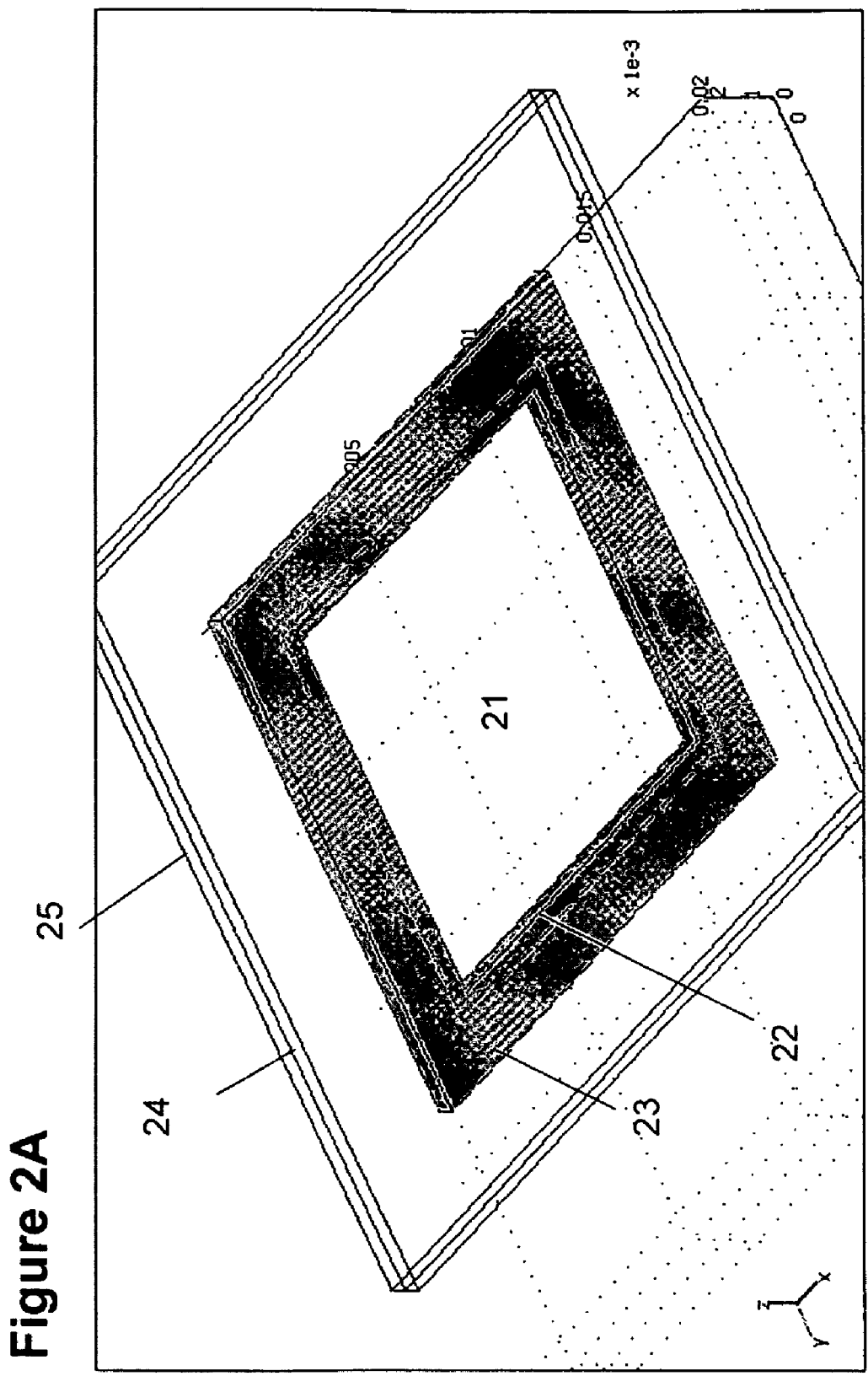
FIG. 2A illustrates a 3-dimensional depiction showing domains of the structure according to an exemplary embodiment of the present invention.

Referring now to the drawings, and more particularly to FIGS. 1B-9B, there are shown exemplary embodiments of the method and structures according to the present invention.

Exemplary Embodiment

As mentioned above, some high performance chips are severely constrained by how effectively the assembly can be cooled. The present inventors have recognized that providing more conductive paths for heat flux to flow will result in more efficient cooling.

Referring now to FIG. 1B, the present invention provides a structure 10 which includes a heat spreader 7 which is formed of silicon or any other material having comparable coefficient of thermal expansion (CTE) to that of silicon which is about 3 ppm/deg C.

The structure of the heat spreader 7 has an exemplary shape (e.g., it may have any shape, but exemplarily the present inventors have shown a first embodiment as having a "rectangular- or square-donut" shape) which preferably substantially completely and snugly surrounds a chip (e.g., shown in FIG. 1B as a heat source 2). The "donut" in the exemplary embodiment has a square donut shape since the heat source has a square shape. Obviously other shapes may be used by the present invention and the invention is not limited to the "donut" (rectangular or square) shape. The plain silicon may be 2 mm wide, but may be within a range of about 2 to about 5 mm. The width advantage is gated by the thickness of the heat generating silicon.

An inner dimension of the donut is preferably snugly fit around a given processor (e.g., heat source 2). An outer dimension of the donut at most can be that of preferably matches the heat sink (e.g., heat sink 5) selected for the application.

The donut should be made of crystalline silicon (e.g., amorphous silicon in which there is a long-range order of the positions of the atoms thereof) to enhance its thermal conductivity. It is noted that the spreader is not limited to silicon, but is preferably thermally matched (e.g., has a coefficient of thermal expansion which is substantially 3.0 (substantially the same as silicon) to the edges of the silicon chip (heat source).

Once put in place, as an attachment layer 6, either SiN, $SiO_2$ or Si (hereinbelow, for ease of discussion, it will be assumed that the $SiO_2$ will be used) is formed at the junction of the spreader and the chip to enhance lateral heat transfer. Typically, this can be a very thin layer on the order of about 5 to about 10 μm. A very thin layer is desirable since one does not want the attachment layer 6 to function much as an thermal insulator, since the invention is directed to removing thermal energy off of the chip.

It is noted that, because the very thin attachment layer is formed at least partly of silicon (e.g., $SiO_2$, SiN, silicon, etc.), generally this material would be insulative. However, the invention does not need it to be insulative, given the applications of the invention. Instead, the invention uses the thin attachment layer 6 preferably formed of $SiO_2$, SiN, silicon, etc., for its ability to enhance the connection of the silicon heat source 2 with the silicon heat spreader 7 (i.e., two silicon substrates) very robustly. SiN and $SiO_2$ are used often in different levels of processing a chip, typically for insulation. Here, it is used for its robust connection characteristics. Further, since all three structures (e.g., spreader 7, attachment layer 6 and heat source 2) are each at least partly made of silicon, there should be no thermal expansion issues and yet heat is removed outwardly. The completed assembly is outlined below.

FIG. 2A illustrates a 3-dimensional view showing the features used for finite element method (FEM)-based computation to analyze the structure 10 of FIG. 1A according to an exemplary embodiment of the present invention.

In FIG. 2A, the bottom boundary of the heat source is shown in the center at reference numeral 21 (FEM domain 5). Also shown is the thin attachment layer (insulator) 22 (FEM domain 4), and the heat spreader 23 (FEM domain 3) (e.g., the plain silicon, for example, having a width of about 0.5 mm to about 2 mm. It is noted that the invention may employ widths greater than 2 mm, but results diminish thereafter. Also shown in FIG. 2A are the thin paste (TIM) 24 (FEM domain 1), and the heat sink 25 (FEM domain 2).

As mentioned above, FIG. 2B illustrates a perspective view of the in-plane lateral silicon heat spreader 23 in an exemplary embodiment.

Figure 2B:
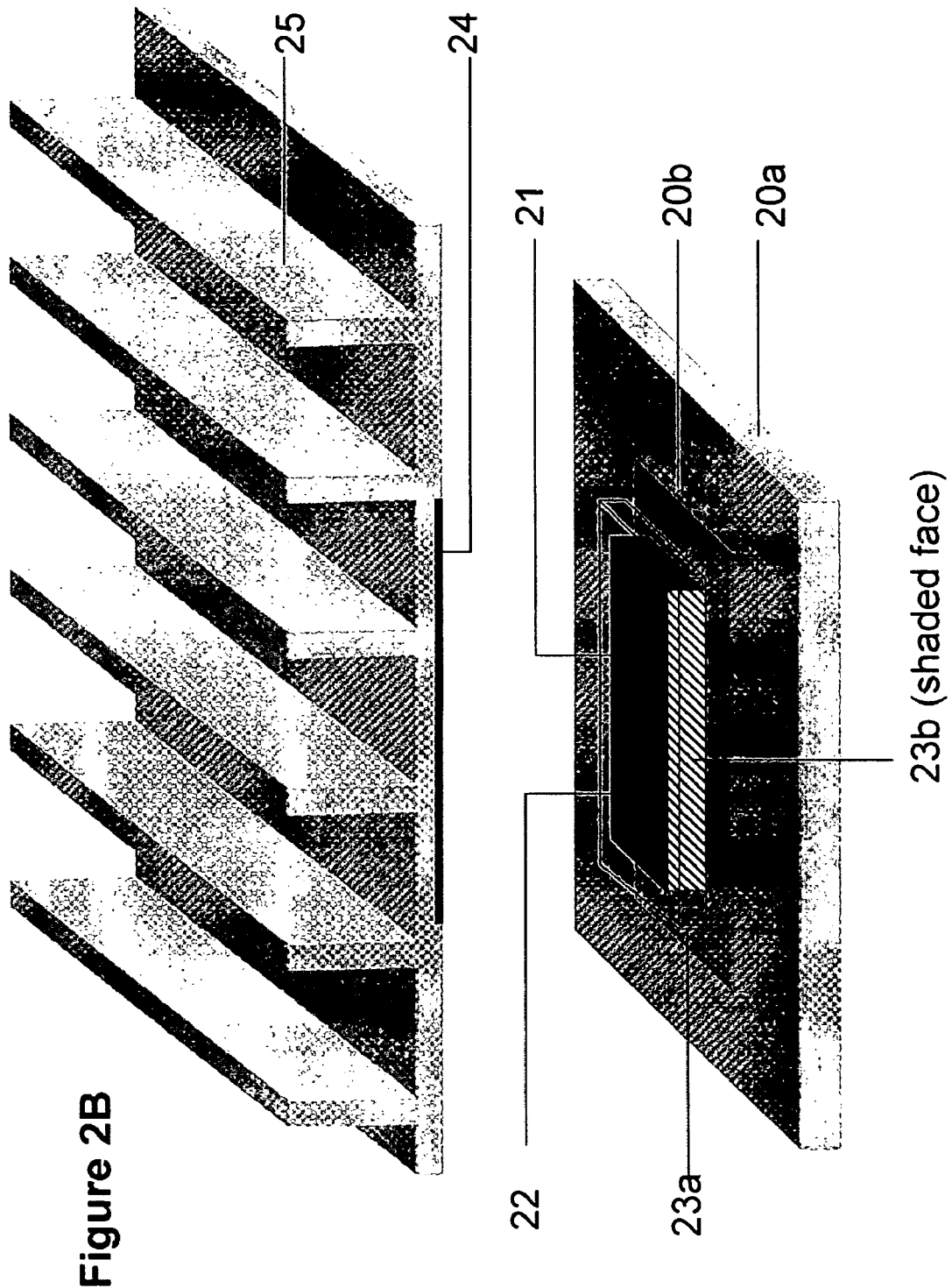
FIG. 2B illustrates a perspective view of the in-plane lateral silicon heat spreader.

As shown in FIG. 2B, 20a and 20b are printed circuit boards with 20a forming the main circuit board and 20b supporting the microprocessor chip 21. $SiO_2$ bonding line is represented by reference numeral 22 which attaches the in-plane lateral heat spreader 23a to the chip 21. The face 23b represents the $SiO_2$ Silicon bonding face which are also shown, along with an $SiO_2$ chip edge. TIM 24 is shown under a finned-heatsink 25.

Figure 3:
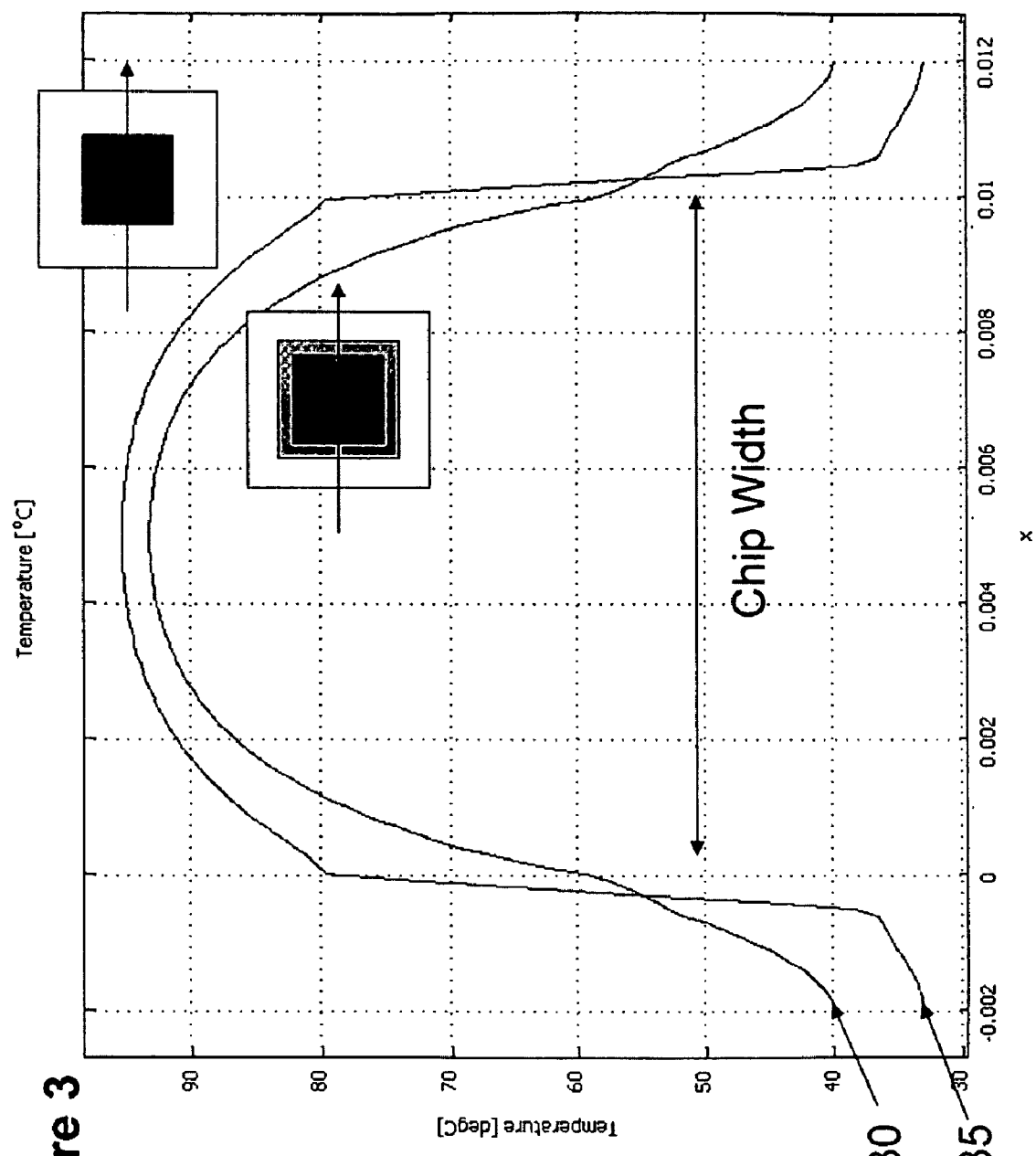
FIG. 3 illustrates a graph of temperature versus chip width.

FIG. 3 illustrates a graph of temperature (on the vertical axis) versus chip width on the horizontal axis. FIG. 3 basically shows the effect of the invention on temperature distribution, and specifically the performance with and without the spreader of the present invention.

Specifically, plot 30 shows the effect of the invention with the spreader (having a slightly larger chip width by virtue of the additional width (e.g., about 2 mm) of the spreader), whereas plot 35 illustrates a higher temperature value (peaking higher than the structure of the invention). This can be easily seen by going across the chip width from 0 to 10 mm, which shows the better thermal performance of the invention.

Thus, as shown, there may be a 2- or 3-degree drop in the center of the chip as compared to not using the spreader, but there is a substantial temperature decrease on the edges of the chip (e.g., by as much as 10 degrees). Hence, in the invention, the heat is pulled sideways (laterally), without adding extra cost or a more complex device, and keeping the temperature in the main silicon to as low a value as possible.

Figure 4B:
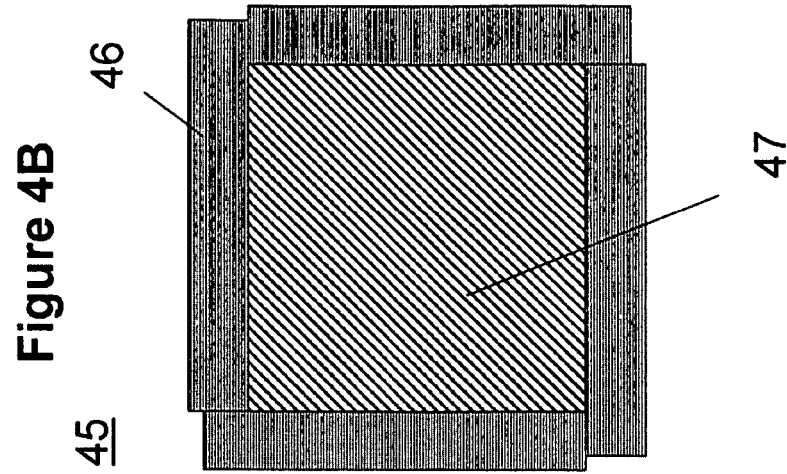
FIG. 4B illustrates a minimum-gap assembly of the spreader according to the invention in a second exemplary configuration.
Figure 4A:
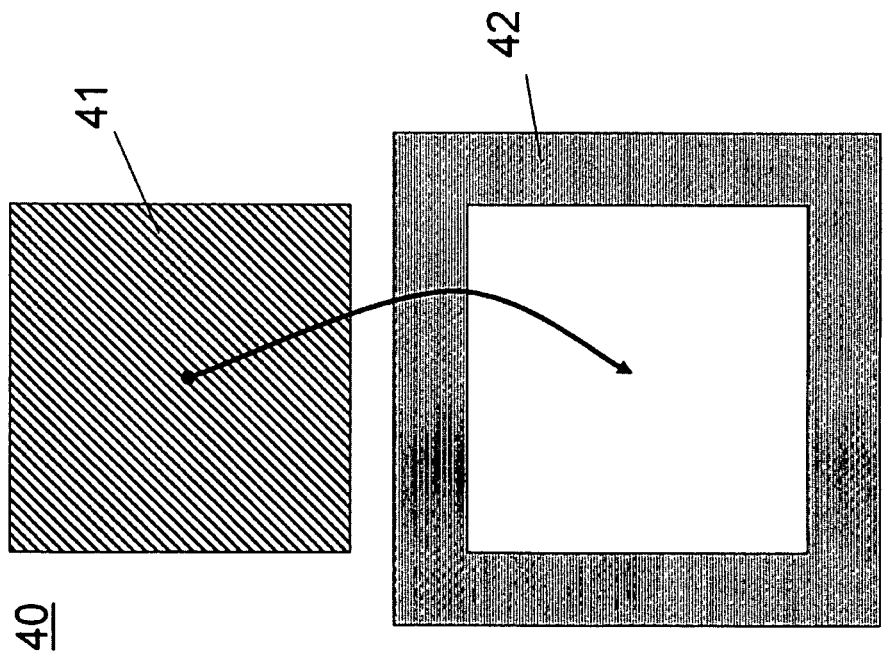
FIG. 4A illustrates a minimum-gap assembly of the spreader according to the invention in a first exemplary configuration.

FIGS. 4A and 4B illustrate several ways of constructing the heat spreader.

Specifically, FIG. 4A illustrates a minimum-gap assembly of the spreader according to the invention in a first configuration. FIG. 4A illustrates that a heat source (chip) 41 may be provided and a heat spreader 42 formed specifically close (e.g., having as small a tolerance or gap as possible between the chip's outer dimensions and the spreader's inner dimensions) to the chip's outer dimensions. Thus, the heat spreader (square "donut") 42 can be formed integrally, and then be arranged around the active chip 41 snugly (similar to a collar) by gluing, bonding, or the like by using the above-described very thin insulative layer ($SiO_2$, SiN, etc.) between the chip 41 and spreader 42. Preferably, the gap between the spreader 42 and the chip 41 should be as small as possible. Thus, while it is easier to produce this configuration, this configuration has drawbacks that tolerances must be tightly controlled and any gap minimized. Otherwise, a thickness of the attachment layer may become larger and disadvantageously serve as an insulator, blocking the heat from being evacuated.

FIG. 4B illustrates a minimum-gap assembly of the spreader according to the invention in a second configuration, in which a microprocessor substrate 46 is surrounded by a plurality (e.g., four in this particular configuration) of independent pieces which are assembled to form the spreader 47. In such a configuration, a gap can be reduced substantially entirely (e.g., near to zero). That is, each piece can be formed almost exactly to touch the respective edges of the substrate 47 and the attachment layer ($SiO_2$, SiN, etc) can be minimized and provided for only in the spaces (e.g., fill in the spaces) which are not perfectly smooth.

Thus, a lateral in-plane heat spreader is provided in which heat can be pulled out of the side of the chip in a very desirable way.

Figure 5:
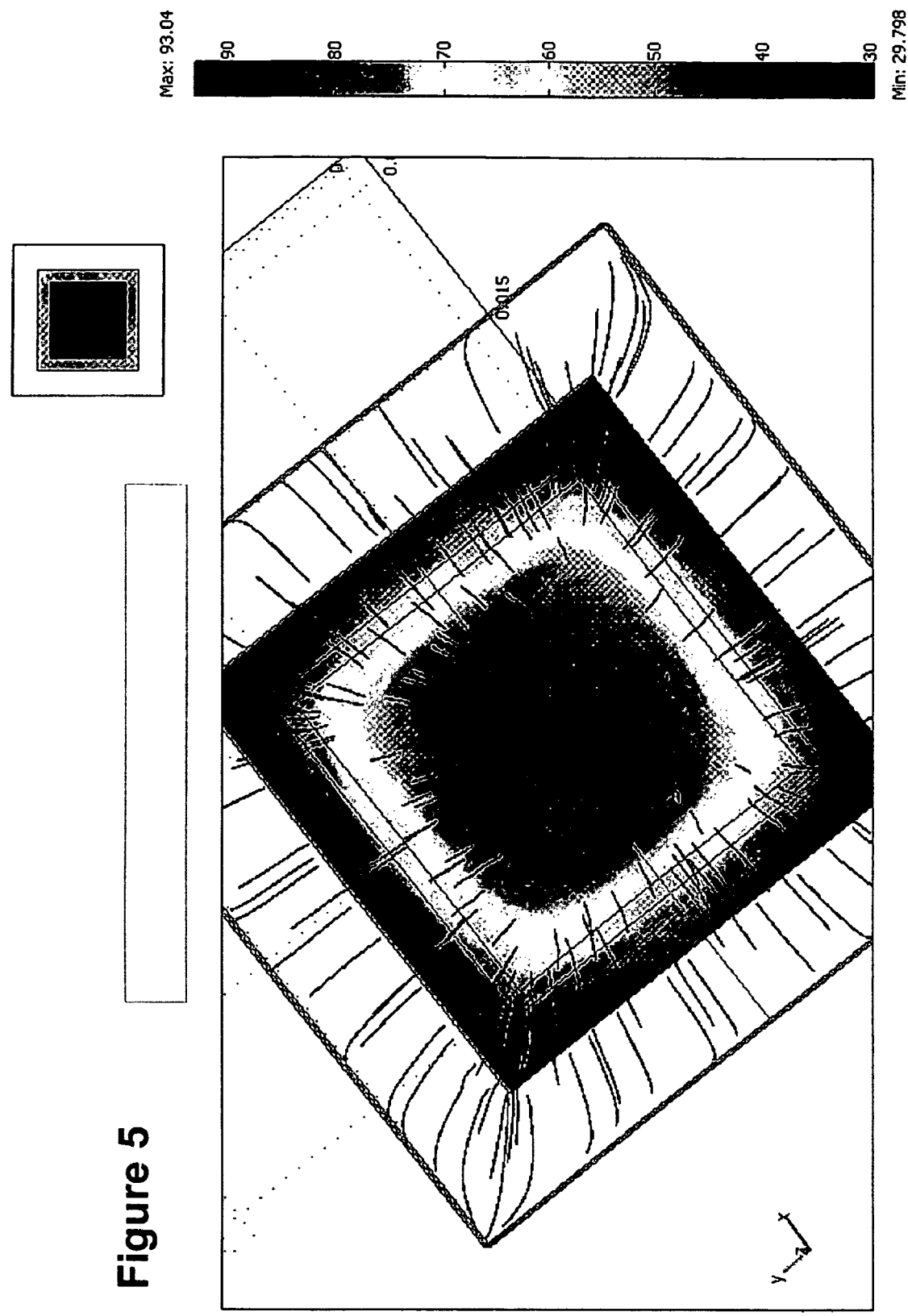
FIG. 5 illustrates an effect of a 2-mm wide spreader according to the present invention.

FIG. 5 illustrates an effect of a 2-mm wide spreader according to the present invention, in which $SiO_2$ was used.

In FIG. 5, the temperature range is shown in which dark portions of the chip are shown (the center is at relatively high temperature) and the spreader is at about room temperature. The edges of the chip are relatively cold, with the heat being shown as coming out of the chip and going sideways (e.g., laterally). As shown, the heat characteristics are improved, in which thermal conductivity k of the $SiO_2$ layer is 1.4 at a gap of 5 μm wide. FIG. 5 shows the in-plane lateral spreader that includes a 5 μm thick $SiO_2$. Then, in FIG. 6, the identical geometry (as FIG. 5) is used with conductivity of $SiO_2$ reduced by ×100 to "simulate" conventional structures.

Figure 6:
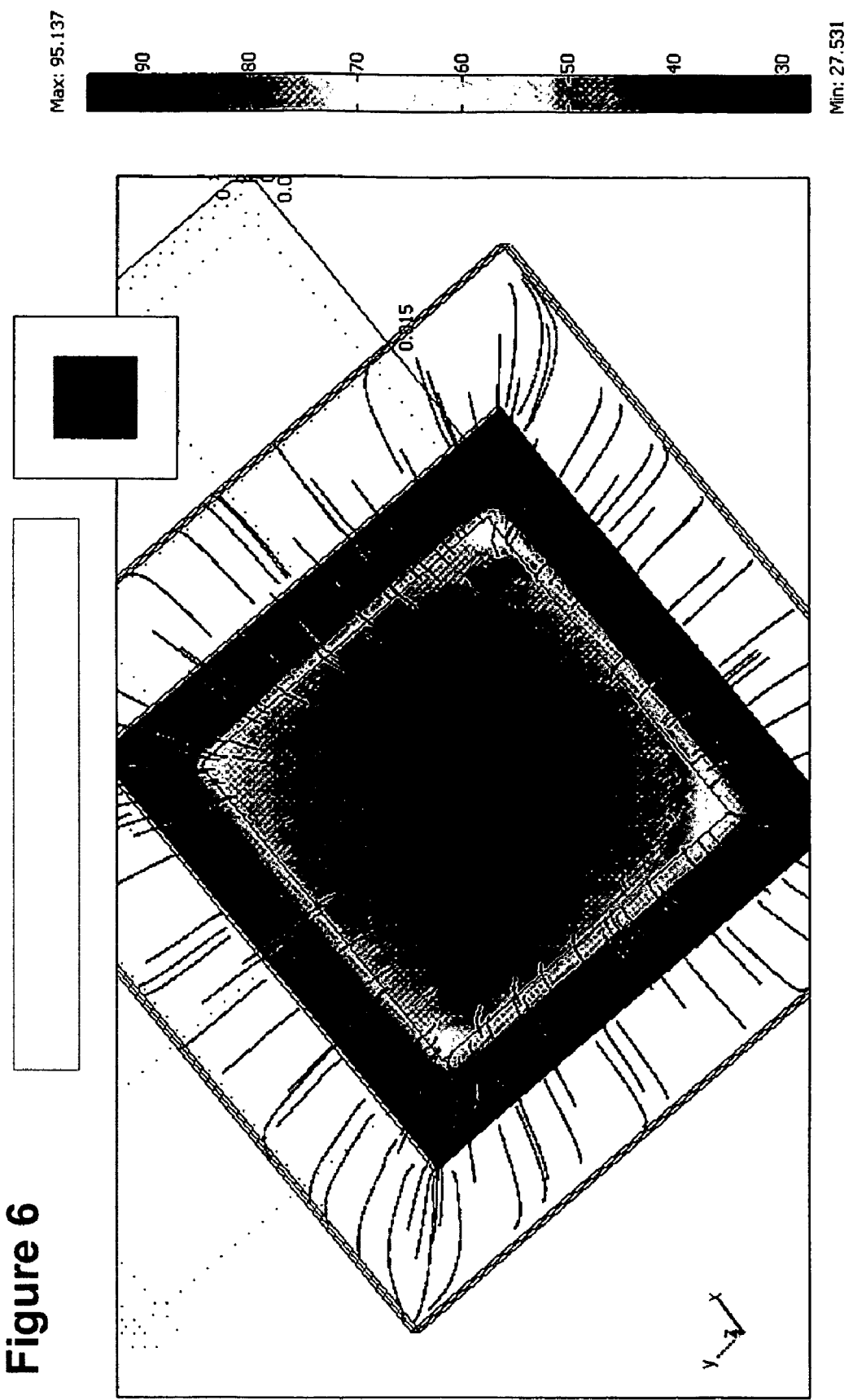
FIG. 6 illustrates a configuration in which there is no effect from the conventional spreader.

FIG. 6 illustrates a configuration in which the effect from the conventional spreader is nullified, as compared to that of the present invention. Such a conventional configuration shows the $SiO_2$ with thermal conductivity k of (1.4/100) at a gap of 5 μm wide. Thus, the thermal conductivity is lower than that of the present invention and that increases the temperature of the area accordingly as shown in FIG. 6.

Figure 7:
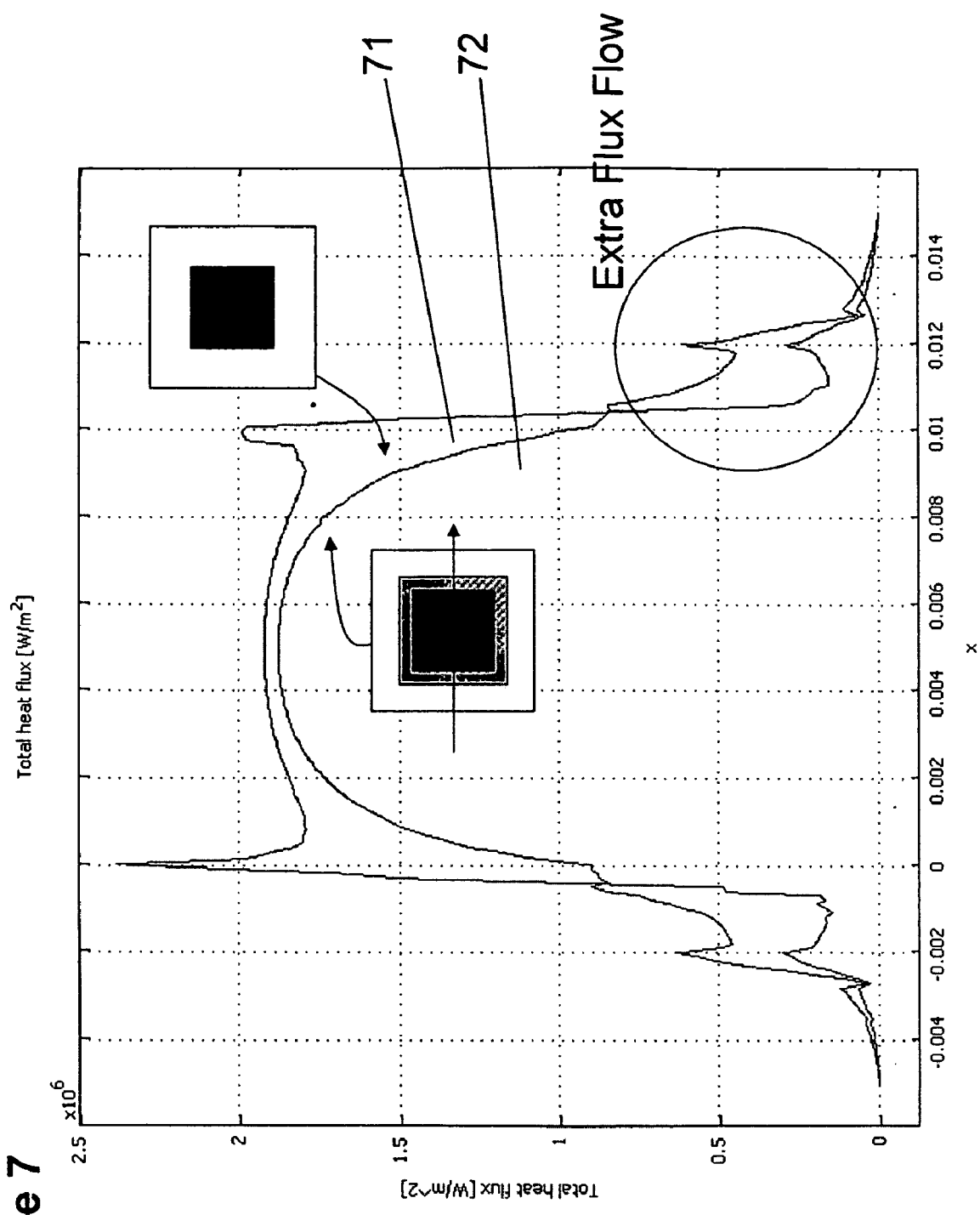
FIG. 7 compares the relationship of total heat flux to chip width.

FIG. 7 compares total heat flux between the conventional structure and the invention.

As shown, plot 71 illustrates the conventional arrangement, whereas plot 72 illustrates the good effects of the invention. That is, FIG. 7 shows the amount of flux that is passing through both of the arrangements, across the chip width. In the general conventional case, where there is not much heat flux going sideways, the flux must go directly and vertically up to the heat sink and out of the structure. Hence, one has a fairly large flux out on the edges of the chip.

In contrast, in the invention, once the heat spreader is attached to the chip, the amount of flux that must go vertically from the edges of the chip can be reduced, since it can now pass through laterally. Thus, the temperature goes down. Hence, the amount of flux that is moving upward is shown on the outside of the chip area where there is a greater increase of the flux flow. Thus, extra flux flow results from the invention as shown.

It is noted that, with regard to FIGS. 5 and 6, the inventors demonstrated that instead of changing the silicon spreader on the collar, the inventors used a highly insulated 5-micron gap in order to take an upper level comparison, thereby to obtain a thermal conductivity 100 times lower than the conventional arrangement (and thus it is equal to not having the spreader there). Hence, that is why when one draws a horizontal/cross-sectional plot as shown in FIG. 7 one still shows some temperature distribution (flux) on the chip edge since there is still some silicon there. Hence, a good upper level comparison can be drawn. Therefore, such an arrangement is equivalent to not having a spreader, resulting in a thermal conductivity 100 times (i.e., the spreader is not doing much) lower than the present invention. This is a convenient way to show the effect and contrast of the conventional case with those of the invention.

Also, with regard to the temperature distribution of FIG. 3, one sees a little bit of a drop just outside of the chip, since air (insulator) is present there and such an insulator will allow some small amount of drop.

It is noted that fabrication of the donut may be performed separately from the chip so that the yield and productivity of the chip fabrication is not impaired. Furthermore, normal chip processing techniques may be used for the fabrication of the donut. The thickness of the donut preferably is the same as the thickness of the chip assembly to maximize the amount of lateral surface area made available to the donut.

Further, it is noted the blank (empty) area of the silicon heat spreader could carry decoupling capacitors or other service structures which decouple independently to the input/output (I/O) pins of the chip. In such a case, metallization would be provided which connects to pins on the chip.

Figure 8:
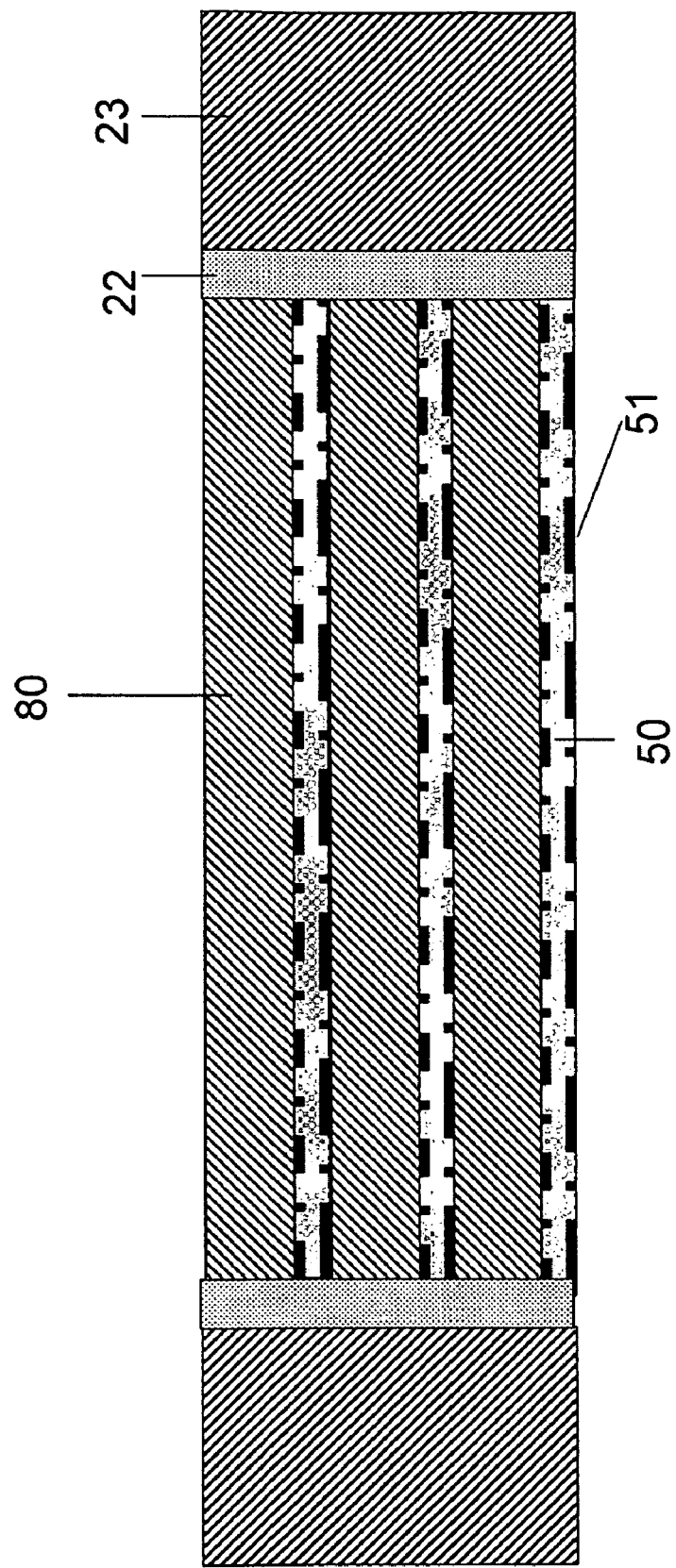
FIG. 8 shows a multilayer chip stack.

Additionally, it is noted that while the description above has been described above with regard to providing a silicon spreader to a single chip, the invention could be equally applied to a plurality of chips being stacked in multiple layers 80, as shown in FIG. 8. Indeed, the invention would find benefit in such a structure.

In FIG. 8, the attachment layer 22 is shown attached to a heat spreader and the stack 80. Reference numerals 50 and 51 respectively show dielectric and circuit interconnects.

That is, since there are a plurality of stacked silicon layers, one has an opportunity to use a spreader with a larger thickness (since there may be, for example, a plurality of chips together), thereby to move the heat out.

Joining a silicon spreader along the edges of a microprocessor chip provides another benefit. That is, FIG. 9A shows dielectric 50 and circuit interconnect 51 that are built on a silicon die. However, along the edges of the silicon there is stress discontinuity. The dielectric layer is known to develop cracks or delamination due to this exposure in the zone denoted by reference numeral 52. FIG. 9B shows that the above-mentioned vulnerability is reduced, if not eliminated, by the presence of a supportive spreader element 23 adjacent to the chip edge.

In sum, a traditional approach has been to attempt to provide a highly-conductive spreader on top of the silicon (heat source) before the heat sink. Hence, the spreader has been interposed between the silicon heat source and the heat sink. Thus, for example, a SiC (e.g., a diamond sheet) has been used to pull the heat and spread it quicker sideways, so the heat sink has the maximum benefit of the heat spreading.

In contrast, the invention wants to take advantage as much as possible of (use) an additional path (heat flux path) before the thermal interface material, and takes advantage of the horizontal increase in area.

While the invention has been described in terms of several exemplary embodiments, those skilled in the art will recognize that the invention can be practiced with modification within the spirit and scope of the appended claims.

Further, it is noted that, Applicant's intent is to encompass equivalents of all claim elements, even if amended later during prosecution.

What is claimed is:

1. A heat spreader attached to a heat source that comprises a semiconductor chip, said heat spreader comprising:
    a silicon structure that provides a plurality of heat flux paths, including a lateral, in-plane heat flux path,
    wherein said heat spreader is mounted in-plane with the heat source.

2. The heat spreader of claim 1, wherein said heat paths further comprise a heat path perpendicular to a plane of the heat source.

3. The heat spreader of claim 1, wherein said silicon structure comprises plain silicon and snugly surrounds a plurality of edges of the heat source for providing said lateral, in-plane path for heat flux evacuation from the heat source.

4. The heat spreader of claim 1, wherein the silicon structure has a thickness in a range of about 0.5 mm to about 2.0 mm.

5. The heat spreader of claim 1, wherein an inner dimension of the silicon structure snugly fits around the heat source and an outer dimension of the heat spreader substantially matches the heat sink, and
    wherein said silicon structure comprises crystalline silicon.

6. The heat spreader of claim 1, wherein said silicon structure is formed integrally.

7. The heat spreader of claim 1, wherein said silicon structure comprises a plurality of discrete portions, wherein each portion is fused to a respective edge of the heat source.

8. A heat spreader attached to a heat source that comprises a semiconductor chip, said heat spreader comprising:
    a silicon structure, mounted in-plane with the heat source to provide a heat flux path which is in-plane to the heat source, thereby to remove heat from the heat source laterally and out to a heat sink, said silicon structure has a coefficient of a thermal expansion which is substantially a same as that of edges of the heat source.

9. The heat spreader of claim 1, wherein said silicon structure snugly surrounds a plurality of edges of the heat source for providing said lateral, in-plane path for heat flux evacuation from the heat source.

10. The heat spreader of claim 8, wherein said silicon structure snugly surrounds the edges of the heat source for providing a lateral, in-plane path for heat flux evacuation from the heat source.

11. The heat spreader of claim 8, wherein said silicon structure comprises plain silicon and snugly surrounds the edges of the heat source for providing a lateral, in-plane path for heat flux evacuation from the heat source.

12. The heat spreader of claim 8, wherein said heat spreader is mounted in-plane with the heat source.

\* \* \* \* \*